US009235136B2

(12) United States Patent
Epple

(10) Patent No.: US 9,235,136 B2
(45) Date of Patent: Jan. 12, 2016

(54) PROJECTION EXPOSURE APPARATUS FOR PROJECTION LITHOGRAPHY

(71) Applicant: Carl Zeiss SMT GmbH, Oberkochen (DE)

(72) Inventor: Alexander Epple, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 14/540,201

(22) Filed: Nov. 13, 2014

(65) Prior Publication Data

US 2015/0070677 A1     Mar. 12, 2015

Related U.S. Application Data

(63) Continuation of application No. PCT/EP2013/060229, filed on May 17, 2013.

(60) Provisional application No. 61/666,016, filed on Jun. 29, 2012.

(30) Foreign Application Priority Data

Jun. 29, 2012   (DE) .......................... 10 2012 211 256

(51) Int. Cl.
G03B 27/54     (2006.01)
G03B 27/72     (2006.01)
G03F 7/20      (2006.01)

(52) U.S. Cl.
CPC ........ *G03F 7/70225* (2013.01); *G03F 7/70258* (2013.01); *G03F 7/70308* (2013.01); *G03F 7/70341* (2013.01); *G03F 7/70575* (2013.01)

(58) Field of Classification Search
CPC ............ G03F 7/70225; G03F 7/70575; G03F 7/70308; G03F 7/70258

USPC .................................. 355/52, 53, 55, 67–71
See application file for complete search history.

(56) References Cited

U.S. PATENT DOCUMENTS 4,811,055 A     3/1989 Hirose
4,883,352 A    11/1989 Bruning
(Continued)

FOREIGN PATENT DOCUMENTS

WO   WO 2006/013100 A2   2/2006
WO   WO 2009/018911 A1   2/2009
WO   WO 2009/030444 A1   3/2009

OTHER PUBLICATIONS

International Search Report for corresponding PCT Appl No. PCT/EP2013/060229, mailed Sep. 25, 2013.
(Continued)

*Primary Examiner* — Hung Henry Nguyen
(74) *Attorney, Agent, or Firm* — Fish & Richardson P.C.

(57) ABSTRACT

A projection exposure apparatus for projection lithography comprises a light source for generating illumination light. An illumination optical unit guides the light to an object field. A catadioptric projection optical unit with at least one curved mirror images an object in the object field onto a substrate in an image field. An object displacement drive- and a substrate displacement drive serve to displace the object and the substrate. A compensation device serves to compensate aberrations of the projection optical unit, which are caused by an arching of the object or the substrate. The compensation device comprises a wavelength manipulation device for manipulating a wavelength of the illumination light during the projection exposure. The result of this is a projection exposure apparatus in which the imaging quality of the projection optical unit is optimized, particularly taking into account a field curvature.

20 Claims, 5 Drawing Sheets

(56) References Cited

U.S. PATENT DOCUMENTS

| | | | |
|---|---|---|---|
| 6,252,647 B1 * | 6/2001 | Shiraishi | G03F 1/14 355/53 |
| 2003/0063268 A1 | 4/2003 | Kneer et al. | |
| 2003/0133087 A1 | 7/2003 | Shima | |
| 2003/0234912 A1 | 12/2003 | Omura | |
| 2008/0204682 A1 | 8/2008 | Uehara et al. | |
| 2010/0201962 A1 * | 8/2010 | Juergens | G03F 7/70258 355/55 |

OTHER PUBLICATIONS

CodeV, Version 10.4, Reference Manual, p. C-6.
German Office Action, with translation thereof, for DE Appl No. 10 2012 211 256.1, dated Jan. 18, 2013.

* cited by examiner

PROJECTION EXPOSURE APPARATUS FOR PROJECTION LITHOGRAPHY

CROSS-REFERENCE TO RELATED APPLICATIONS

The present application is a continuation of, and claims benefit under 35 USC 120 to, international application PCT/EP2013/060229, filed May 17, 2013, which claims benefit under 35 USC 119 of German Application No. 10 2012 211 256.1, filed Jun. 29, 2012. International application PCT/EP2013/060229 also claims priority under 35 USC 119(e) to U.S. Provisional Application No. 61/666,016, filed Jun. 29, 2012. The entire disclosure of international application PCT/EP2013/060229 and German Application No. 10 2012 211 256.1 are incorporated by reference herein.

The invention relates to a projection exposure apparatus for projection lithography. The invention furthermore relates to a method for producing a structured component using such a projection exposure apparatus and to a microstructured or nanostructured component produced according to this method.

A projection exposure apparatus for projection lithography is known from U.S. Pat. No. 4,811,055 A, WO 2009/030 444 A2, WO 2006/013 100 A2, WO 2009/018 911 A1, US 2003/0 133 087 A1 and US 2010/0 201 962 A1. US 2008/0 204 682 A1 discloses an exposure method and an exposure apparatus and a device manufacturing method. U.S. Pat. No. 4,883,352 relates to deep-UV lithography.

Catadioptric projection optical units enable high quality object imaging, which is required during the projection exposure. Here, use is made of, in particular, illumination light with a wavelength in the DUV (deep ultraviolet) range, i.e. with wavelengths of less than 300 nm, less than 250 nm, less than 200 nm, for example with a wavelength of 193 nm, or else with even shorter wavelengths.

The imaging quality of such projection optical units is so high that external influences, for example the influence of gravity on the shape of the object to be imaged or on the substrate on which imaging should take place can no longer be neglected. Particularly in the case of a vertical design of the projection optical unit and a corresponding horizontal position of the object field and/or the image field, an arching of the object and/or substrate, undesirable per se, can occur due to gravity-induced sagging. This sagging leads to the condition that, in actual fact, a curved object field has to be imaged and/or that, in actual fact, imaging needs to take place onto a curved image field.

Topological effects, which are not influenced by gravity but can occur on the object or on the substrate, also lead to a deviation of the object field or the image field from a planar state, which impairs the imaging quality.

It is an object of the present invention to develop a projection exposure apparatus in such a way that the imaging quality of the projection optical unit is optimized, particularly taking into account a field curvature.

According to the invention, this object is achieved by a projection exposure apparatus for projection lithography
  with a light source for generating illumination light,
  with an illumination optical unit for guiding the illumination light to an object field,
  with a catadioptric projection optical unit with at least one curved mirror for imaging an object, which is arranged in the object field, onto a substrate, which is arranged in an image field,
  with an object holder for holding the object,
  with an object displacement drive for displacing the object through the object field during a projection exposure of the object,
  with a substrate holder for holding the substrate,
  with a substrate displacement drive for displacing the substrate through the image field during the projection exposure,
  with a compensation device for compensating aberrations of the projection optical unit, which are caused by a curvature of at least one of the fields from the group containing
    object field and
    image field,
  wherein the compensation device comprises a wavelength manipulation device for manipulating a wavelength of the illumination light during the projection exposure.

According to the invention, it was identified that aberrations which are caused by an object field curvature or an image field curvature and, in particular, by an arching of the object or the substrate, can be compensated for by compensation based on modification or manipulation of the used light wavelength. In the process, the projection exposure apparatus is operated in such a way that a field curvature during the imaging is modified during the operation in such a way that the imaging capability of the projection optical unit is adapted to the current shape of the object to be imaged or of the substrate on which the imaging takes place. The manipulation of the wavelength of the illumination light in a catadioptric projection optical unit with at least one curved mirror leads to a change in the Petzval sum. To good approximation, the following applies:

$$\frac{dP}{d\lambda} = \frac{1}{n_L} \sum_{lenses} \left(\frac{1}{r_1} - \frac{1}{r_2}\right) \frac{dn_G}{d\lambda}$$

Here, P is the Petzval sum of a catadioptric projection optical unit, for which the following applies:

$$P = \frac{n_G - n_L}{n_L} \sum_{lenses} \left(\frac{1}{r_1} - \frac{1}{r_2}\right) + \sum_{mirrors} \left(\frac{2}{r}\right),$$

$\lambda$ is the wavelength of the illumination light 4,
$n_G$ is the refractive index of the lens element material of the catadioptric projection optical unit,
$n_L$ is the refractive index between the optical components of the projection optical unit,
$r_1$ and $r_2$ are the vertex radii of the entry surface and the exit surface of the respective lens element of the catadioptric projection optical unit and
r is the vertex radius of curvature of the respective mirror of the catadioptric projection optical unit.

The formulas are presented above in an exemplary fashion for a single-material system, i.e. assume that all lens elements are made of the same material with refractive index $n_G$. Of course, alternatively it is also possible to use the invention in catadioptric projection lens designs with several, different lens element materials.

Since the refractive index of the glass $n_G(\lambda)$ depends on the wavelength of the illumination light as a result of dispersion, the wavelength manipulation device therefore enables access to the current value of the Petzval sum and hence an influencing of the field curvature. The field curvature due to a deviation of the object or the substrate from the planar state, particularly as a result of arching caused by gravity, can therefore be compensated for by the wavelength manipulation.

In the following text, "arching" is understood to mean any deviation of a base surface of the object to be imaged or of a base surface of the wafer in the direction of the optical axis, onto which the imaging should take place. Here, "base surface of the object" is understood to mean that surface which carries the structures to be imaged.

In principle, with the aid of the compensation device it is also possible to compensate for a change in shape of at least one optical component of the projection optical unit, which change in shape has an effect on the field curvature. By way of example, such a change in shape can be caused by heating of refractive or reflective optical components of the projection optical unit as a result of a remaining absorption of the illumination light. In this case, the compensation device can also operate with a longer time constant which is matched to the time constant of the effects to be compensated for.

The catadioptric projection optical unit can be a linear arrangement of optical components or else, alternatively, a folded projection optical unit, in particular with precisely one mirror located close to the pupil. By way of example, such a projection optical unit is known from US 2003/0234912 A1.

An embodiment of the wavelength manipulation device such that it is possible to tune the wavelength in the region of less than 0.1 nm was found to be sufficient for practical requirements. Such tunability still lies within the natural emission bandwidth of gas lasers typically used for DUV projection lithography.

An embodiment of the wavelength manipulation device such that wavelength manipulation occurs within a period of less than 1 s, enables compensation during a scanning process of the projection exposure. By way of example, a first used light wavelength can be set at the beginning of the scanning process, which is modified in a predetermined fashion during the scanning process by the wavelength manipulation device. The time constant of the wavelength manipulation can also be less than 1 s, for example 0.5 s, 0.1 s or even shorter. To the extent that the compensation device is employed for the compensation of thermal effects, the time constant can also be significantly longer than 1 s and can, for example, lie in the region of one minute or even longer.

An embodiment of the wavelength manipulation device as part of the light source or comprising a wavelength tunable laser resonator can be realized on the basis of currently employed light sources. A wavelength tunability of the tunable laser resonator can be realized by a spectral selection component, for example a filter or a grating, housed in the laser resonator. Alternatively, it is possible to realize a wavelength tunable laser resonator by way of a parametric frequency conversion.

A wavelength manipulation device which comprises at least one unit arranged separately from the light source can likewise be realized by a spectrally selective component, for example by a grating or a filter. Alternatively, a parametric frequency conversion is also possible in this case.

The light source can be a gas laser or a solid-state laser. In the case of the solid-state laser, this can be a diode-pumped solid-state laser.

As a result of an embodiment of the wavelength manipulation device with at least one displacement drive for displacing a wavelength tuning unit for the used light during the projection exposure, an adaptive frequency conversion can be realized with the wavelength manipulation device. A different predetermined used light wavelength results depending on the position of the wavelength manipulation device predetermined by the displacement drive.

In addition to the wavelength manipulation device, the compensation device can comprise at least one displacement manipulator for displacing at least one optical component from the following group:
the object,
the substrate,
at least one optical component of the projection optical unit, during the projection exposure. It is also possible to displace the object or the substrate via appropriate displacement manipulators. In particular, provision can be made for several displacement manipulators. A typical displacement path of the displacement manipulators can be less than 50 µm. Corresponding displacement manipulators can, for example, be realized by piezo-actuators.

A displacement only along an optical axis, in which the displacement manipulator is configured to displace the respective component only along an optical axis of the projection optical unit, was found to be particularly suitable for compensating field archingdependent aberrations.

To the extent that the object field of the projection optical unit is arranged off-axis, i.e. to the extent that a reference axis to be used to describe the shape of the mirror surfaces does not pass through the object field, it is also possible to predetermine a tilt of the image field from an untilted original position. This can realize symmetric field arching about a center of the image field, which is then likewise off-axis.

An arrangement of displacement manipulators in which only refractive optical components of the projection optical unit have displacement manipulators was found to be particularly suitable.

A catadioptric projection optical unit with at least one curved mirror for imaging an object, which is arranged in an object field, onto a substrate, which is arranged in an image field, suitable for use in a projection exposure apparatus according to the invention, can be used as a replacement projection optical unit for an already existing projection optical unit which does not enable field curvature compensation. The projection optical unit can comprise a compensation device with at least one displacement manipulator for displacing at least one optical component of the projection optical unit during the projection exposure. The at least one displacement manipulator can be configured as already explained above in the context of the projection exposure apparatus according to the invention. It is possible that only refractive optical components of the projection optical unit have displacement manipulators.

The advantages of a method for producing a structured component, comprising the following method steps:
providing a reticle and a wafer,
projecting a structure on the reticle onto a light-sensitive layer of the wafer with the aid of the projection exposure apparatus according to the invention,
synchronized scanning of the reticle and the wafer during the projection exposure with the aid of a corresponding actuation of the object displacement drive and the substrate displacement drive,
readjusting the projection exposure apparatus during the scanning with the aid of the compensation device,
generating a microstructure and/or nanostructure on the wafer, and of a microstructured or nanostructured component produced according to this method correspond to those which were already explained above with reference to the projection exposure apparatus according to the invention.

Exemplary embodiments of the invention will be explained in more detail below on the basis of the drawing. In detail:

FIG. 1 schematically shows a meridional section of optical main groups of a projection exposure apparatus for microlithography;

Figure 2:
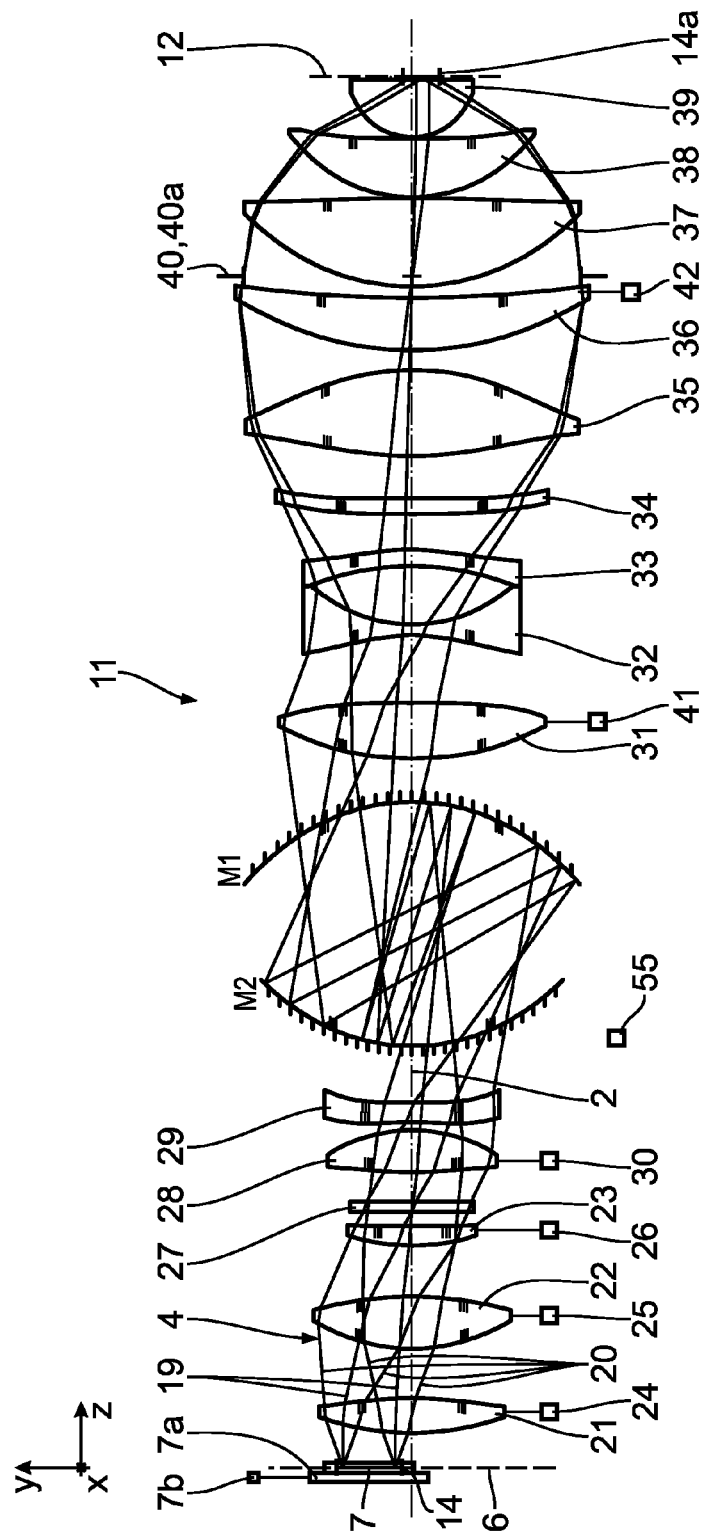
FIG. 2 shows a more detailed meridional section of a catadioptric projection optical unit, i.e. having lens elements and mirrors, of the projection exposure apparatus.
Figure 6:
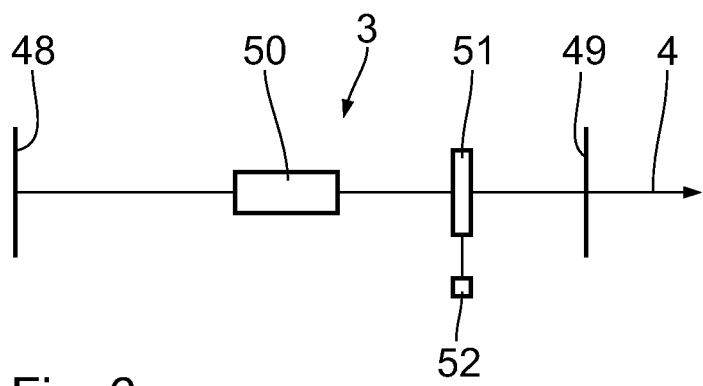
FIG. 6 shows an embodiment of a light source in the form of a tunable laser resonator with a wavelength tuning unit arranged intra-cavity, i.e. within the resonator.
Figure 7:
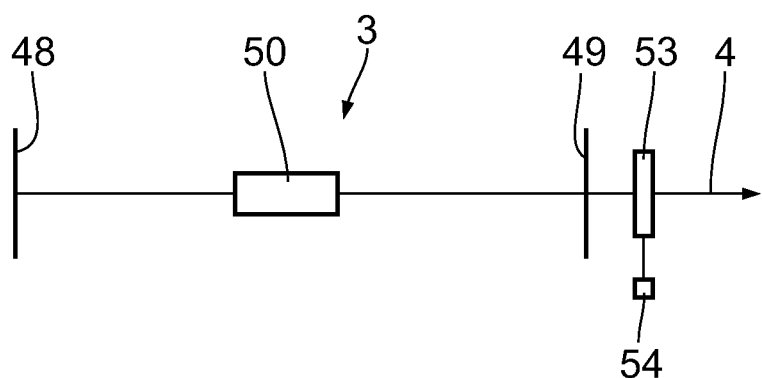
Figure 8:
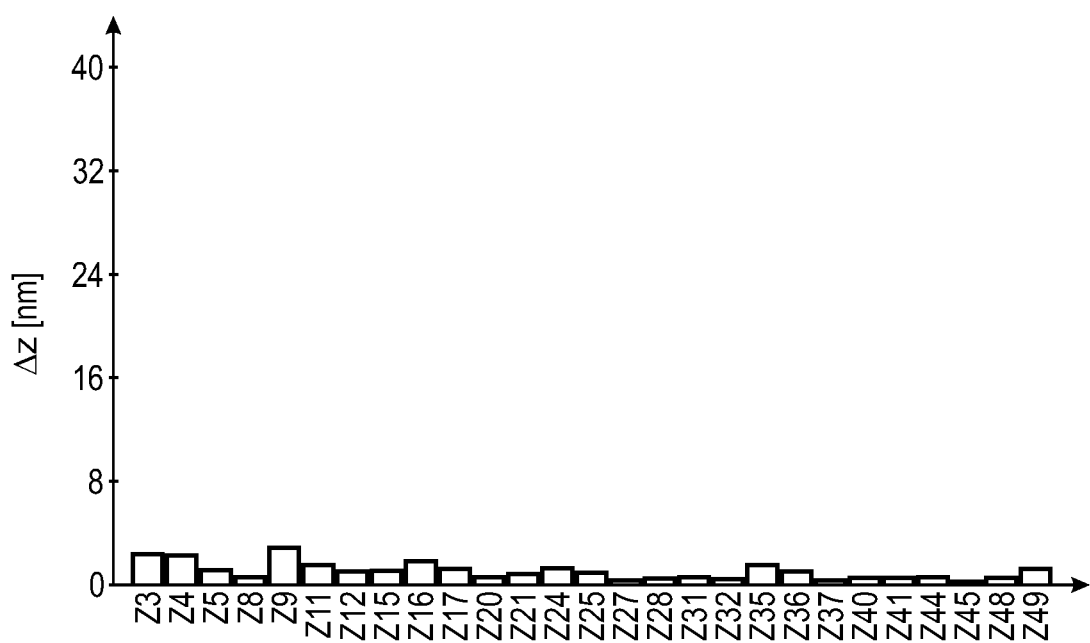

FIG. 7 shows a further embodiment of the light source, in a similar illustration to that of FIG. 6, likewise in the form of a laser resonator with an external wavelength tuning unit for tuning a used emission wavelength; and FIG. 8 shows a histogram illustration of a remaining aberration of the projection optical unit according to FIG. 2, illustrated as an expansion of Zernike polynomials using the Fringe sort, where a histogram bar height illustrates the relative measure of a contribution of the respective Zernike polynomial.

Figure 1:
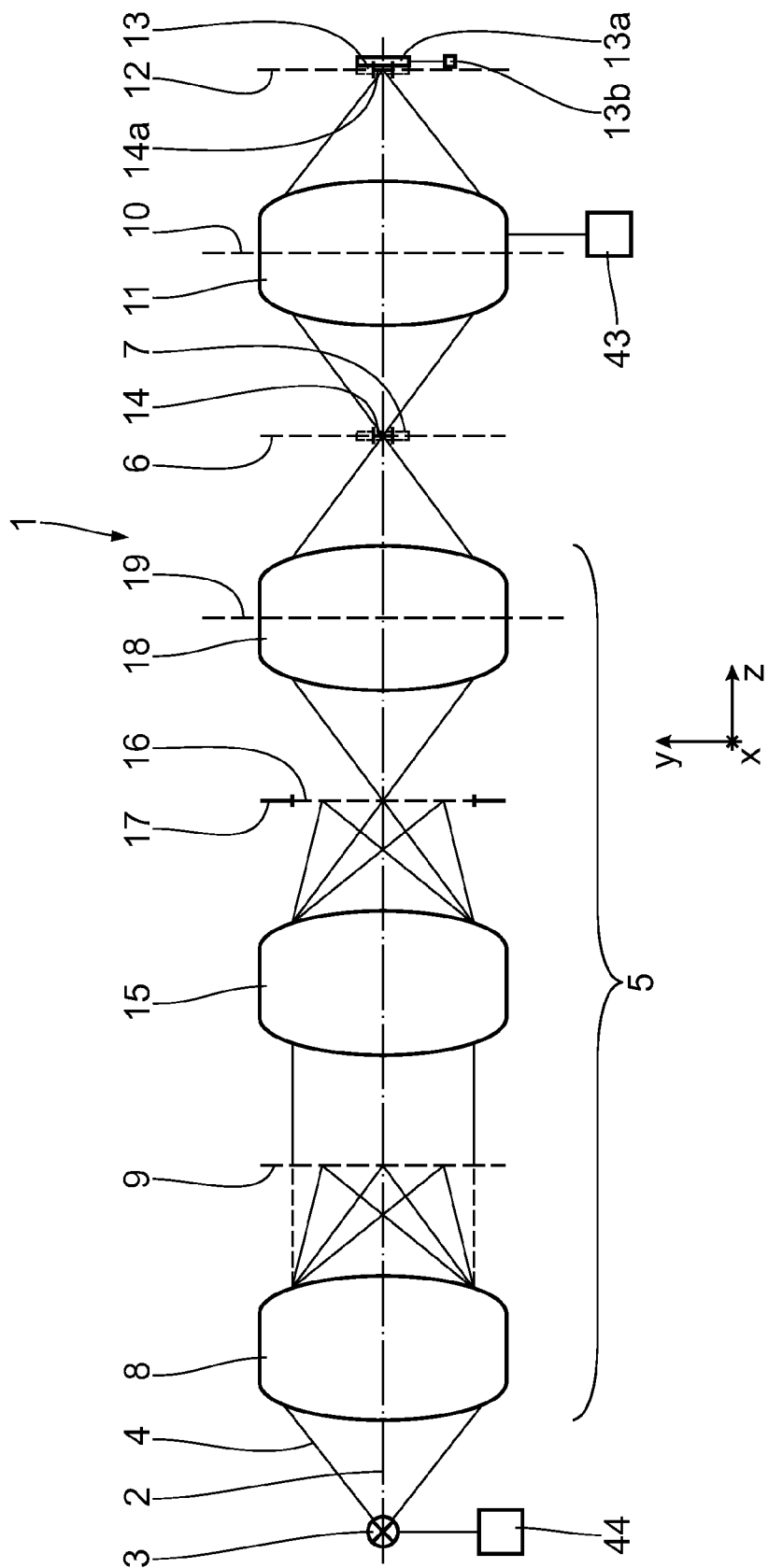

In terms of its optical main groups, a projection exposure apparatus 1 is illustrated schematically in a meridional section in FIG. 1. This schematic illustration shows the optical main groups as refractive optical elements. However, the optical main groups can just as easily be embodied as diffractive or reflective components or as combinations or subcombinations of refractive/diffractive/reflective sets of optical components.

In order to simplify the illustration of positional relations, use is made below of an xyz-coordinate system. In FIG. 1, the x-axis extends perpendicular to the plane of the drawing and into the latter. The y-axis extends upward in FIG. 1. In FIG. 1, the z-axis extends to the right and parallel to an optical axis 2 of the projection exposure apparatus 1. If need be, this optical axis 2 can also be folded a number of times.

The projection exposure apparatus 1 comprises a light or radiation source 3, which generates used light in the form of an illumination or imaging beam 4. The used light 4 has a wavelength in the deep ultraviolet range (DUV), for example in the range between 100 and 200 nm, for example at 193 nm.

An illumination optical unit 5 of the projection exposure apparatus 1 guides the used light 4 from the radiation source 3 to an object plane 6 of the projection exposure apparatus 1. An object, in the form of a reticle 7, to be imaged by the projection exposure apparatus 1 is arranged in the object plane 6. In FIG. 1, the reticle 7 is illustrated in a dashed manner. The reticle 7 is held by a holding device 7a (compare FIG. 2) in the form of an object holder. The object holder 7a is mechanically connected to an object displacement drive 7b (compare FIG. 2). Via the object displacement drive 7b, the reticle 7 is displaced in the object plane 6 during a projection exposure of an object or reticle section on the reticle 7. Thus, a controlled scanning displacement is possible via the object displacement drive 7b.

As first optical main group, the illumination optical unit 5 initially comprises a pupil shaping optical unit 8. The latter serves to generate a defined intensity distribution of the used light 4 in a downstream pupil plane 9. The pupil shaping optical unit 8 moreover serves as setting device for prescribing different illumination settings. Corresponding setting devices, which for example comprise adjustable optical components or interchangeable stops, are known to a person skilled in the art. The pupil shaping optical unit 8 images the radiation source 3 in a plurality of secondary light sources in the pupil plane 9. The pupil shaping optical unit 8 can additionally also have a field shaping function. Facet elements, honeycomb elements and/or diffractive optical elements can be used in the pupil shaping optical unit 8. The pupil plane 9 is optically conjugate to a further pupil plane 10 of a projection lens 11 of the projection exposure apparatus 1. The projection lens 11 is arranged downstream of the illumination optical unit 5 between the object plane 6 and an image plane 12. A substrate or wafer 13 is arranged in the image plane 12 and illustrated in a dashed manner in FIG. 1. The wafer 13 is held by a holding device 13a in the form of a substrate holder. The substrate holder 13a is connected to a substrate displacement drive 13b. Via the latter, a controlled scanning displacement of the wafer 13, synchronized to the object displacement via the object displacement drive 7b, is possible in turn.

An object field 14 in the object plane 6 is imaged by the projection lens 11 in an image field 14a in the image plane 12. During the projection exposure, the respective section of the reticle 7 to be exposed is displaced through the object field 14 and the respective section of the wafer 13 to be exposed is displaced through the image field 14a.

Figure 4:
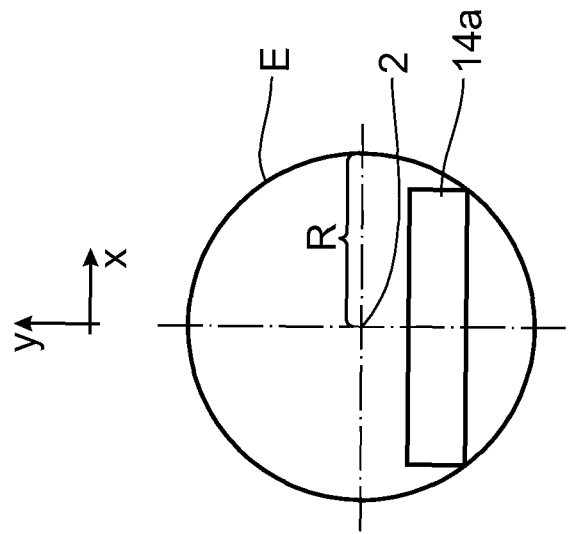
FIG. 4 shows a greatly magnified plan view of an image field of the projection optical unit according to FIG. 2.

The object field 14 and the image field 14a are arranged off axis. Thus, the optical axis 2 intersects neither the object field 14 nor the image field 14a. FIG. 4 shows the image field 14a in a greatly magnified plan view compared to FIG. 2. A circle E around the optical axis 2, in which the image field 14a is inscribed, is also illustrated. FIG. 4 clarifies the off-axis arrangement of the image field 14a. In the x-direction, the image field 14a has an extent of 26 mm. In the y-direction, the image field 14a has an extent of 5.5 mm. The circle E has a radius R of 16 mm.

The image field 14a is rectangular.

A field lens element group 15 as a further optical main group of the illumination optical unit 5 is arranged downstream of the pupil plane 9 arranged behind the pupil shaping optical unit 8. Arranged behind the field lens element group 15 is an intermediate image plane 16, which is conjugate to the object plane 6. The field lens element group 15 therefore constitutes a condenser group. A stop 17 for predetermining a peripheral limit of the object field 14 lies in the intermediate image plane 16. The stop 17 is also referred to as a REMA (reticle masking) stop (system for stopping down the reticle 7).

The intermediate image plane 16 is imaged into the object plane 6 by a lens group 18, which is also referred to as a REMA lens element group. The lens group 18 constitutes a further optical main group of the illumination optical unit 5.

FIG. 2 shows the catadioptric design of the projection optical unit 11 in greater detail. Components corresponding to those that were already explained above with reference to FIG. 1 are denoted by the same reference signs and will not be discussed in detail once again. FIG. 2 illustrates an imaging beam path of the used light 4, proceeding from an upper peripheral field point and a lower peripheral field point, with chief rays 19 and coma or peripheral rays 20 being illustrated in each case.

In the imaging beam path of the used light 4, three lens elements 21, 22 and 23 are first of all arranged downstream of the object field 14. Each of the three lens elements respectively has a displacement manipulator 24, 25, 26 for displacing the lens element along the z-axis, i.e. along the optical axis 2. The object displacement drive 7b enables a displacement of the reticle 7 along the z-axis. The substrate displacement drive 13b enables a displacement of the substrate 13 along the z-axis.

A plane parallel plate 27 is arranged downstream of the lens element 23 in the imaging beam path of the used light 4, which plane parallel plate is arranged in the region of a first pupil plane of the projection optical unit 11 after the object plane 6. Two further lens elements 28, 29 are arranged downstream of the plane parallel plate 27 in the imaging beam path of the used light 4. The lens element 28 is in turn connected to a z-displacement manipulator 30.

A mirror group with two mirrors M1, M2 is arranged downstream of the lens element 29 in the projection optical unit 11, which mirrors are numbered in accordance with the sequence in the imaging beam path in which they are impinged upon. The two mirrors M1 and M2 are concave mirrors.

An intermediate image plane of the projection optical unit 11 lies in the beam path between the last lens element 29 in front of the mirror group and the mirror M1. A further pupil plane of the projection optical unit 11 lies in the beam path between the two mirrors M1 and M2. A further intermediate image plane of the projection optical unit 11 is arranged downstream of the mirror M2 in the beam path of the used light 4.

Further lens elements 31, 32, 33, 34, 35, 36, 37, 38 and 39 of the projection optical unit 11 are arranged in the imaging beam path of the used light 4 downstream of this further intermediate image plane. A further pupil plane 40 of the projection optical unit 11 is arranged in the beam path between the lens elements 36 and 37. There, a stop 40a ensures a peripheral pupil limit.

The lens elements 31 and 36 are in turn respectively connected to a z-displacement manipulator 41, 42.

The last lens element 39 ahead of the image field 14a is an immersion lens element. A layer of liquid, for example a layer of water, is arranged between an exit surface of this last lens 39 and the wafer 13.

An image field-side numerical aperture of the projection optical unit 11 is 1.35. The imaging scale is $\beta=-0.25$. The projection optical unit 11 therefore provides a reduction by a factor of 4.

The following tables show the design data of the projection exposure apparatus 1 illustrated in FIG. 2. Starting with the object plane 6, the first table shows the optical surfaces of the projection optical unit 11, i.e. the lens elements 21, 22, 23, of the plane parallel plate 27 (surfaces 7 and 8), of the lens elements 28 and 29, of the mirrors M1 and M2 (surfaces 13 and 14) and of the lens elements 31 to 39, numbered from left to right, in the first column "surface". The surface 27 denotes the position of the pupil plane 40 between the lens elements 36 and 37. The surfaces 0 and 34 denote the object plane 6 and the image plane 12.

The column "radii" reproduces the radius of curvature of the respective optical surface. The column "thicknesses" reproduces the distance of the respective optical surface to the subsequent optical surface.

The column "material" provides information in respect of the utilized lens element material and information in respect of the purge gas filling between the optical components. The purge gas is nitrogen at atmospheric pressure. Between the exit surface of the lens element 39 (surface 33) and the image plane 12 (surface 34), water ($H_2O$) is present as immersion liquid.

The column "INDEX" specifies the refractive index of the materials for various wavelengths of the used light 4. These wavelengths are 193.380 nm (Index 1), 193.280 nm (Index 2) and 193.480 nm (Index 3).

The column "radius" reproduces half of the clear diameter of the respective optical component.

| SURFACE | RADII | THICK-NESSES | MATE-RIAL | INDEX 1 | INDEX 2 | INDEX 3 | RADIUS |
|---|---|---|---|---|---|---|---|
| 0 | 0.000000 | 31.759048 | AIR | 1.000310 | 1.000310 | 1.000310 | 64.0 |
| 1 | 247.070898 | 32.517407 | SIO2 | 1.560810 | 1.560968 | 1.560652 | 80.4 |
| 2 | −263.811788 | 45.560181 | N2 | 1.000308 | 1.000308 | 1.000307 | 81.2 |
| 3 | 169.053766 | 48.404277 | SIO2 | 1.560810 | 1.560968 | 1.560652 | 86.9 |
| 4 | −368.086892 | 47.234989 | N2 | 1.000308 | 1.000308 | 1.000307 | 85.0 |
| 5 | 185.753521 | 18.790767 | SIO2 | 1.560810 | 1.560968 | 1.560652 | 54.8 |
| 6 | −500.159392 | 12.284277 | N2 | 1.000308 | 1.000308 | 1.000307 | 52.5 |
| 7 | 0.000000 | 10.000000 | SIO2 | 1.560810 | 1.560968 | 1.560652 | 49.5 |
| 8 | 0.000000 | 27.279702 | N2 | 1.000308 | 1.000308 | 1.000307 | 52.6 |
| 9 | 325.735203 | 38.972261 | SIO2 | 1.560810 | 1.560968 | 1.560652 | 70.2 |
| 10 | −144.062035 | 6.921997 | N2 | 1.000308 | 1.000308 | 1.000307 | 74.1 |
| 11 | −414.564236 | 18.613207 | SIO2 | 1.560810 | 1.560968 | 1.560652 | 76.4 |
| 12 | −1765.343112 | 278.578542 | N2 | 1.000308 | 1.000308 | 1.000307 | 75.5 |
| 13 | −181.854688 | −226.465132 | REFL | 1.000308 | 1.000308 | 1.000307 | 152.0 |
| 14 | 178.675152 | 266.446053 | REFL | 1.000308 | 1.000308 | 1.000307 | 136.4 |
| 15 | 337.624758 | 51.432732 | SIO2 | 1.560810 | 1.560968 | 1.560652 | 118.8 |
| 16 | 17867.818911 | 63.053338 | N2 | 1.000308 | 1.000308 | 1.000307 | 117.7 |
| 17 | −210.999702 | 9.997051 | SIO2 | 1.560810 | 1.560968 | 1.560652 | 96.0 |
| 18 | 140.728614 | 54.200330 | N2 | 1.000308 | 1.000308 | 1.000307 | 90.0 |
| 19 | −252.445356 | 15.010933 | SIO2 | 1.560810 | 1.560968 | 1.560652 | 91.4 |
| 20 | −218.274994 | 33.033279 | N2 | 1.000308 | 1.000308 | 1.000307 | 95.9 |
| 21 | −766.623704 | 14.953717 | SIO2 | 1.560810 | 1.560968 | 1.560652 | 119.2 |
| 22 | −928.383310 | 38.966437 | N2 | 1.000308 | 1.000308 | 1.000307 | 121.3 |
| 23 | 350.094270 | 79.452619 | SIO2 | 1.560810 | 1.560968 | 1.560652 | 146.4 |
| 24 | −224.073324 | 18.418527 | N2 | 1.000308 | 1.000308 | 1.000307 | 149.8 |
| 25 | 304.542517 | 48.599673 | SIO2 | 1.560810 | 1.560968 | 1.560652 | 160.0 |
| 26 | 1443.008579 | 19.823380 | N2 | 1.000308 | 1.000308 | 1.000307 | 157.8 |
| 27 | 0.000000 | −9.283246 | N2 | 1.000308 | 1.000308 | 1.000307 | 156.4 |
| 28 | 212.280257 | 81.747275 | SIO2 | 1.560810 | 1.560968 | 1.560652 | 151.8 |
| 29 | −3392.891171 | 0.997846 | N2 | 1.000308 | 1.000308 | 1.000307 | 145.7 |

-continued

| SURFACE | RADII | THICK-NESSES | MATE-RIAL | INDEX 1 | INDEX 2 | INDEX 3 | RADIUS |
|---|---|---|---|---|---|---|---|
| 30 | 139.889405 | 54.502008 | SIO2 | 1.560810 | 1.560968 | 1.560652 | 110.6 |
| 31 | 1625.208440 | 0.991910 | N2 | 1.000308 | 1.000308 | 1.000307 | 99.7 |
| 32 | 59.189082 | 53.056196 | SIO2 | 1.560810 | 1.560968 | 1.560652 | 54.6 |
| 33 | 0.000000 | 3.000000 | H2O | 1.436601 | 1.436815 | 1.436388 | 24.4 |
| 34 | 0.000000 | 0.000000 | | | | | 16.0 |

The exit surface of the lens element 21 (surface 2), the entry and exit surfaces of the lens element 22 (surface 3 and 4), the exit surface of the lens element 23 (surface 6), the entry surface of the lens element 28 (surface 9), the entry and exit surfaces of the lens element 29 (surfaces 11 and 12), the mirror surfaces (surfaces 13 and 14), the entry and exit surfaces of the lens element 31 (surfaces 15 and 16), the entry surface of the lens element 32 (surface 17), the exit surface of the lens element 23 (surface 20), the entry and exit surfaces of the lens elements 34 and 35 (surfaces 21 to 24), the exit surface of the lens element 36 (surface 26), the exit surface of the lens element 37 (surface 29) and the exit surface of the lens element 38 (surface 31) are embodied as aspherical surfaces according to the aspherical lens element formula:

$$p(h) = \frac{\rho h^2}{1 + \sqrt{1 - (1+K)\rho^2 h^2}} + C4 \cdot h^4 + C6 \cdot h^6 + C8 \cdot h^8 + \ldots$$

Here, $\rho = 1/r$ is the curvature of the surface of the vertex of the aspherical lens element. h is the distance of a point on the optical surface of the aspherical lens element from the axis of rotational symmetry of the optical surface, which is also referred to as optical axis, extending in the z-direction. p(h), the sagittal height, is the z-distance between an observed point with distance h ($h^2 = x^2 + y^2$) from the axis of rotational symmetry to the vertex of the optical surface of the aspherical lens, i.e. the point on the optical surface with h=0. The coefficients C4 ff belong to further even powers of h, from and including $h^4$.

The following tables show the coefficients K and C4 to C18, which are to be respectively inserted into this aspherical lens element equation in order to obtain the respective aspherical optical surface.

Surface No. 2

| K | 0 |
|---|---|
| C4 | 1.777272E-07 |
| C6 | -1.449052E-11 |
| C8 | 1.223683E-15 |
| C10 | -4.987233E-20 |
| C12 | -6.582019E-25 |
| C14 | -3.804540E-28 |
| C16 | 1.326675E-31 |
| C18 | -8.683158E-36 |

Surface No. 3

| K | 0 |
|---|---|
| C4 | 5.103453E-08 |
| C6 | -1.664833E-11 |
| C8 | 3.316785E-15 |
| C10 | -6.303665E-19 |
| C12 | 8.348798E-23 |

-continued

| C14 | -7.836887E-27 |
|---|---|
| C16 | 4.515814E-31 |
| C18 | -9.538279E-36 |

Surface No. 4

| K | 0 |
|---|---|
| C4 | -3.406717E-08 |
| C6 | 4.417137E-12 |
| C8 | 1.699257E-16 |
| C10 | -3.018279E-19 |
| C12 | 6.416936E-23 |
| C14 | -7.125023E-27 |
| C16 | 4.604496E-31 |
| C18 | -1.249126E-35 |

Surface No. 6

| K | 0 |
|---|---|
| C4 | 3.381636E-07 |
| C6 | 1.857207E-11 |
| C8 | -3.298112E-14 |
| C10 | 4.110491E-17 |
| C12 | -2.744606E-20 |
| C14 | 1.089793E-23 |
| C16 | -2.403917E-27 |
| C18 | 2.178433E-31 |

Surface No. 9

| K | 0 |
|---|---|
| C4 | -1.545959E-07 |
| C6 | -7.751042E-12 |
| C8 | 1.498079E-15 |
| C10 | 2.171339E-19 |
| C12 | 1.738395E-23 |
| C14 | -5.803560E-27 |
| C16 | -3.918490E-31 |
| C18 | 6.411151E-35 |

Surface No. 11

| K | 0 |
|---|---|
| C4 | 3.706082E-07 |
| C6 | -9.178060E-12 |
| C8 | 1.124953E-16 |
| C10 | 3.243072E-19 |
| C12 | -1.871177E-22 |
| C14 | 3.376723E-26 |
| C16 | -3.209315E-30 |
| C18 | 1.393246E-34 |

Surface No. 12

| K | 0 |
|---|---|
| C4 | 4.445980E−07 |
| C6 | −2.284881E−11 |
| C8 | −7.197840E−16 |
| C10 | 5.997156E−19 |
| C12 | −1.338318E−22 |
| C14 | 1.835494E−26 |
| C16 | −2.060696E−30 |
| C18 | 1.183657E−34 |

Surface No. 13

| K | −0.4 |
|---|---|
| C4 | −2.972170E−10 |
| C6 | −1.215077E−14 |
| C8 | −2.180237E−19 |
| C10 | 1.807766E−24 |
| C12 | −4.866002E−28 |
| C14 | 8.024000E−33 |
| C16 | 6.855383E−38 |
| C18 | −6.711156E−42 |

Surface No. 14

| K | −0.4 |
|---|---|
| C4 | 1.139351E−09 |
| C6 | 1.257614E−14 |
| C8 | −1.200963E−18 |
| C10 | 7.094892E−23 |
| C12 | −5.329323E−27 |
| C14 | 2.349203E−31 |
| C16 | −6.425743E−36 |
| C18 | 6.006527E−41 |

Surface No. 15

| K | 0 |
|---|---|
| C4 | 5.966965E−08 |
| C6 | −2.102790E−12 |
| C8 | 4.719312E−17 |
| C10 | −3.865822E−21 |
| C12 | 4.635901E−25 |
| C14 | −6.415316E−29 |
| C16 | 4.078673E−33 |
| C18 | −9.731447E−38 |

Surface No. 16

| K | 0 |
|---|---|
| C4 | −8.023687E−08 |
| C6 | 1.092079E−12 |
| C8 | 9.726221E−17 |
| C10 | −8.491316E−21 |
| C12 | 2.654305E−25 |
| C14 | −3.209899E−30 |
| C16 | 1.278909E−34 |
| C18 | −9.524843E−39 |

Surface No. 17

| K | 0 |
|---|---|
| C4 | 3.868018E−08 |
| C6 | 1.326145E−11 |
| C8 | −2.034229E−15 |
| C10 | 1.637028E−19 |
| C12 | −7.502765E−24 |

-continued

| C14 | 4.713839E−28 |
|---|---|
| C16 | −4.265303E−32 |
| C18 | 1.654303E−36 |

Surface No. 20

| K | 0 |
|---|---|
| C4 | 1.816773E−07 |
| C6 | −4.074781E−12 |
| C8 | −4.731014E−17 |
| C10 | 4.088017E−20 |
| C12 | −1.255457E−23 |
| C14 | 1.354406E−27 |
| C16 | −6.271462E−32 |
| C18 | 1.269710E−36 |

Surface No. 21

| K | 0 |
|---|---|
| C4 | 2.720811E−07 |
| C6 | −3.439780E−11 |
| C8 | 3.936929E−15 |
| C10 | −3.529547E−19 |
| C12 | 2.244616E−23 |
| C14 | −9.810223E−28 |
| C16 | 2.663632E−32 |
| C18 | −3.369863E−37 |

Surface No. 22

| K | 0 |
|---|---|
| C4 | 1.567637E−07 |
| C6 | −2.117279E−11 |
| C8 | 2.729532E−15 |
| C10 | −2.333222E−19 |
| C12 | 1.265924E−23 |
| C14 | −4.255070E−28 |
| C16 | 7.787971E−33 |
| C18 | −4.606623E−38 |

Surface No. 23

| K | 0 |
|---|---|
| C4 | −3.311111E−08 |
| C6 | 3.727378E−13 |
| C8 | 5.147570E−17 |
| C10 | −4.872417E−21 |
| C12 | 1.426392E−25 |
| C14 | −2.279673E−30 |
| C16 | 8.028483E−35 |
| C18 | −1.850668E−37 |

Surface No. 24

| K | 0 |
|---|---|
| C4 | 2.516939E−08 |
| C6 | −2.745772E−13 |
| C8 | 2.476708E−17 |
| C10 | −6.266372E−22 |
| C12 | 5.208046E−26 |
| C14 | −7.109731E−30 |
| C16 | 3.277751E−34 |
| C18 | −1.850668E−37 |

Surface No. 26

| K | 0 |
|---|---|
| C4 | −7.215715E−09 |
| C6 | 1.361449E−12 |
| C8 | −7.671269E−17 |
| C10 | 2.630362E−21 |
| C12 | 2.617133E−28 |
| C14 | −4.588952E−30 |
| C16 | 1.512086E−34 |
| C18 | −1.850668E−37 |

Surface No. 29

| K | 0 |
|---|---|
| C4 | −1.770812E−08 |
| C6 | 2.748581E−12 |
| C8 | −1.556234E−16 |
| C10 | −1.125058E−21 |
| C12 | 5.688926E−25 |
| C14 | −2.789977E−29 |
| C16 | 5.947307E−34 |
| C18 | −1.850668E−37 |

Surface No. 31

| K | 0 |
|---|---|
| C4 | −1.301656E−08 |
| C6 | 7.337512E−12 |
| C8 | −1.990586E−16 |
| C10 | −3.560700E−20 |
| C12 | 6.312667E−24 |
| C14 | −4.575356E−28 |
| C16 | 1.612861E−32 |
| C18 | −1.850668E−37 |

Figure 3:
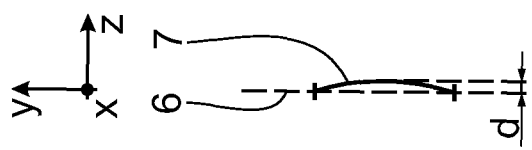
FIG. 3 shows a view of an object in the form of a reticle in the region of an object field of the projection optical unit, wherein an arching of the object is illustrated in an exaggerated fashion.

In practice, the projection optical unit 11 can be housed in the projection exposure apparatus 1 in such a way that the z-axis extends in the vertical direction. Here, the image plane 12 is generally arranged below the object plane 6. In this case, the reticle 7 or the wafer 13 can sag d as a result of gravity, which is illustrated schematically and in a much exaggerated fashion in FIG. 3 for the reticle 7.

As an alternative to a sagging effect, or in addition thereto, there can also be arching or unevenness of the reticle 7 or of the wafer 13 as a result of deviations of a reticle or wafer polish from the desired planar result. Such polish unevenness of the wafer can be primarily noticed by a tilt and by a curvature (arching) of the image field 14a. The tilt of the wafer 13 can be compensated for by tilting the holding device 13a.

A z-manipulator of the object displacement drive 7b and of the substrate displacement drive 13b and also the z-displacement manipulators 24, 25, 26, 30, 41 and 42 are components of a displacement compensation module 43 of a compensation device for compensating aberrations which are caused by an arching of the reticle 7 or of the wafer 13, i.e., for example, as a result of the sag d as a result of the influence of gravity.

The compensation device furthermore includes a wavelength manipulation device 44 for manipulating a wavelength of the used light 4 during the projection exposure, i.e. during the scanning operation, during which a section of the reticle 7 and of the wafer 13 are respectively scanned through the object field 14 and the image field 14a and, in the process, structures on the respectively exposed section of the reticle 7 are transferred onto the wafer 13. The wavelength manipulation device 44 is configured in such a way that a tunability of the wavelength of the used light or illumination light 4 in the region of less than 0.1 nm is provided. The wavelength manipulation device 44 is configured in such a way that a tunability of the wavelength of the used light 4 can occur within a period of 1 s or even faster.

Figure 5:
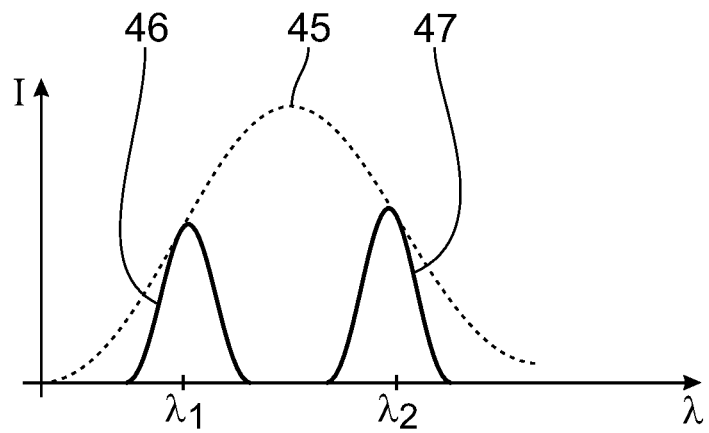
FIG. 5 shows a diagram of a natural emission bandwidth of a light source of the projection exposure apparatus with two employed emission bandwidths, which are illustrated in an exemplary fashion and can optionally be adjusted, about two different central wavelengths $\lambda 1$, $\lambda 2$.

FIG. 5 shows, in an exemplary fashion, a natural emission bandwidth 45 of the light source 3 embodied as a laser. This is, in particular, a gas laser in this case. The wavelength of the respectively utilized used light 4 is selected within the natural emission bandwidth 45 via a spectral selection, for example via a filter or a grating. FIG. 5 illustrates, in an exemplary fashion, two optionally usable emission bandwidths 46, 47, centered about two different wavelengths λ1 and λ2, which can be selected within the natural emission bandwidth 45 via the spectral selection. The spectral selection can be configured in such a way that a continuous selection of the used light wavelength is possible within the natural emission bandwidth 45.

FIGS. 6 and 7 show two examples for a tuning unit as a component of the wavelength manipulation device 44. Two resonator mirrors 48, 49 and a laser-active medium 50 are respectively illustrated as components of the light source 3. The right-hand resonator mirror 49 in FIGS. 6 and 7 is embodied as a partly transmissive mirror for the used light wavelength such that the used light 4 passes through this resonator mirror 49.

In the embodiment according to FIG. 6, a tuning unit 51 of the wavelength manipulation device 44, which can for example be designed as a filter or grating, is arranged intra-cavity, i.e. in the beam path between the resonator mirrors 48, 49.

The intra-cavity tuning unit 51 can be displaced with the aid of a displacement drive 52. Depending on the position of the intra-cavity tuning unit 51, the latter selects a different used light wavelength within the natural emission bandwidth 45 of the laser-active medium 50. This creates a wavelength prescription for the used light 4.

In the embodiment according to FIG. 7, a tuning unit 53 of the wavelength manipulation device 44 is arranged extra-cavity, i.e. outside of the resonator with the resonator mirrors 48, 49. Laser emission light therefore initially passes through the partly transmissive resonator mirror 49 with the natural emission bandwidth 45. The used light wavelength can then be selected from the natural emission bandwidth 45 via the extra-cavity tuning unit 53, which is in turn connected to a displacement drive 54, in accordance with the position of the tuning unit 53. The used light 4 with the selected used light wavelength is then available in the beam path of the emission light downstream of the tuning unit 53.

Just like the wavelength manipulation device 44, i.e., for example, the displacement drives 52 and 54, the z-displacement manipulators 7b, 24, 25, 26, 30, 41, 42 and 13b are also signal-connected to a central control device 55 (compare FIG. 2) in a manner not illustrated in any more detail. Here, the z-displacement manipulators 7b, 24, 25, 26, 30, 41, 42 and 13b and the wavelength manipulation device 44 are moved simultaneously and with a fixed predetermined relation with respect to one another in order to be able to influence the field curvature in a targeted manner.

In other embodiments of projection optical units, it is also possible for other optical components to be equipped with displacement manipulators, for example other lens elements than lens elements 21, 22, 23, 28, 31 and 36 and, in particular, the mirrors M1 and M2 as well.

In the following text, exemplary data for operating the compensation device with the wavelength manipulation device 44 and the displacement compensation module 43 are described. A field arching, due to gravity in particular, as a result of the reticle 7 or the wafer 13 sagging, i.e. the sag d of the reticle 7 in the z-direction in the described exemplary embodiment, is compensated for by carrying out the following manipulations during the scanning exposure:

| Component | z-manipulation value |
|---|---|
| Reticle 7 | 27.03 μm |
| Wafer 14 | −8.35 μm |
| Wavelength | 13.96 pm |
| Lens element 21 | 25.97 μm |
| Lens element 22 | 41.97 μm |
| Lens element 23 | 6.62 μm |
| Lens element 28 | 0.91 μm |
| Lens element 31 | −5.97 μm |
| Lens element 36 | 16.43 μm |

The displacement values relate to a displacement in the positive z-direction. As a result of the displacement values, the image field 14a is curved in such a way that the corners of the image field 14a, which lie on the circle E, are defocused in the z-direction by 128 nm with respect to an image position of a penetration point of the optical axis 2 through the image plane 12. Thus, the wavelength of the illumination light 4 is modified by 0.01396 nm during the scanning exposure. By way of example, the central wavelength is increased during the scanning exposure from 193.380 nm to 193.39396 nm.

The sag d in particular leads to the curvature of the reticle 7 changing over the scanning path in the y-direction to be carried out during the projection exposure, the object section to be imaged in actual fact thus having a time-varying object curvature which is correspondingly translated into an image curvature. The compensation device with the displacement compensation module 43 and the wavelength manipulation device 44 serves to compensate this influence of the changing object curvature by an adaptive correction depending on the respective scanning position of the reticle 7. This is achieved by a Petzval correction, in which the wavelength dependence of the Petzval sum in catadioptric projection optical units is used via wavelength manipulation.

Via the above-described wavelength and displacement manipulations, a field curvature is manipulated, in which the field in the region of the wafer 13 lies offset by 128 nm in the z-direction in the outermost corners of the image field 14a.

FIG. 8 shows a maximum remaining error of a wavefront of the projection optical unit 11, illustrated as a difference to the undisturbed variant without field curvature. Shown in each case are the maxima of an expansion according to Fringe-Zernike polynomials over representative field points. An association between the actual mathematical form of the respective Zernike polynomial and the abridged version ZX (e.g. Z3, Z11) is for example specified in: CodeV, Version 10.4, Reference Manual, page C-6. It becomes clear that the remaining errors, which respectively lie at less than 3 nm, are smaller than the z-offset caused by the field curvature by significantly more than one order of magnitude, which z-offset, as already shown, is 128 nm.

A further embodiment of the light source 3 with the wavelength manipulation device 44 can contain a solid-state laser, for example a titanium sapphire laser or a neodymiumbased solid-state laser (e.g. Nd:YAG) or Ce-doped laser materials (e.g. Ce:LISAF), in which a tuning unit for a wavelength range required for the projection exposure is achieved by a parametric frequency conversion. Here, a laser fundamental frequency of the solid-state laser can, in particular, be doubled in frequency, tripled in frequency or quadrupled in frequency. A larger tuning range can be achieved with the aid of an optical-parametric sum frequency generation, an optical-parametric difference frequency generation or an optical-parametric oscillator. Materials for the parametric frequency conversion are nonlinear crystals with different refractive indices which depend on a distinguished crystal axis, which is also referred to as optical axis. A person skilled in the art knows suitable crystals by the abbreviations BBO (beta barium borate), LBO (lithium borate), KTP (potassium titanyl phosphate), $LiNbO_3$ (lithium niobate).

At least part of the reticle 7 is, with the aid of the projection exposure apparatus 1, imaged on a region of a light-sensitive layer on the wafer 13 for the lithographic production of a microstructured or nanostructured component. Here, during the scanner operation, the reticle 7 and the wafer 13 are displaced continuously in the y-direction in a timesynchronized manner.

The invention claimed is:

1. An apparatus, comprising:
   an illumination optical unit configured to guide illumination light to an object field;
   a catadioptric projection optical unit comprising a curved mirror configured to image an object in the object field onto a substrate in an image field; and
   a compensation device configured to compensate aberrations of the projection optical unit caused by a curvature of at least one field selected from the group consisting of the object field and the image field,
   wherein:
      the compensation device comprising a wavelength manipulation device configured to manipulate a wavelength of the illumination light during use of the apparatus;
      the wavelength manipulation device is configured to change a Petzval sum of the catadioptric projection optical unit; and
      the apparatus is a lithography projection exposure apparatus.

2. The apparatus of claim 1, further comprising a light source configured to provide the illumination light.

3. The apparatus of claim 1, further comprising:
   an object holder configured to hold the object;
   an object displacement drive configured to displace the object through the object field during use of the apparatus;
   a substrate holder configured to hold the substrate; and
   a substrate displacement drive configured to displace the substrate through the image field during use of the apparatus.

4. The apparatus of claim 1, wherein the wavelength manipulation device is configured to tune the illumination light in the region of less than 0.1 nm.

5. The apparatus of claim 1, wherein the wavelength manipulation device is configured so that a time constant of the wavelength manipulation is at most one minute.

6. The apparatus of claim 1, wherein the wavelength manipulation device is configured so that a wavelength manipulation occurs within less than one second.

7. The apparatus of claim 1, further comprising a light source configured to provide the illumination light, wherein the wavelength manipulation device is part of the light source.

8. The apparatus of claim 1, wherein the wavelength manipulation device comprises a displacement drive configured to displace a wavelength tuning unit for used light during use of the apparatus.

9. The apparatus of claim 1, wherein the wavelength manipulation device comprises a wavelength tunable laser resonator.

10. The apparatus of claim 1, further comprising a light source configured to provide the illumination light, wherein the wavelength manipulation device comprises a unit arranged separately from the light source.

11. The apparatus of claim 1, wherein the compensation device comprises a displacement manipulator configured to displace a component during use of the apparatus, and the component is selected from the group consisting of the object, the substrate, and an optical component of the projection optical unit.

12. The apparatus of claim 11, wherein only refractive optical components of the projection optical unit have displacement manipulators.

13. The apparatus of claim 1, wherein the compensation device comprises a displacement manipulator configured to displace a component along an optical axis of the projection optical unit during use of the apparatus, and the component is selected from the group consisting of the object, the substrate, and an optical component of the projection optical unit.

14. The apparatus of claim 1, wherein the wavelength manipulation device is configured to tune the illumination light in the region of less than 0.1 nm, and the wavelength manipulation device is configured so that a time constant of the wavelength manipulation is at most one minute.

15. The apparatus of claim 14, wherein the wavelength manipulation device is configured so that a wavelength manipulation occurs within less than one second.

16. The apparatus of claim 15, further comprising a light source configured to provide the illumination light, wherein the wavelength manipulation device is part of the light source.

17. The apparatus of claim 1, wherein the wavelength manipulation device is configured to tune the illumination light in the region of less than 0.1 nm, and the wavelength manipulation device is configured so that a wavelength manipulation occurs within less than one second.

18. The apparatus of claim 17, further comprising a light source configured to provide the illumination light, wherein the wavelength manipulation device is part of the light source.

19. The apparatus of claim 15, further comprising a light source configured to provide the illumination light, wherein the wavelength manipulation device is part of the light source, and the wavelength manipulation device is configured to tune the illumination light in the region of less than 0.1 nm.

20. A, comprising:
using the apparatus of claim 1 to project a structure of a reticle onto a light-sensitive material supported by a wafer while scanning the reticle and the wafer in a synchronized fashion; and
using the compensation device to readjust while scanning.

* * * * *

UNITED STATES PATENT AND TRADEMARK OFFICE
CERTIFICATE OF CORRECTION

Page 1 of 1

PATENT NO.      : 9,235,136 B2
APPLICATION NO. : 14/540201
DATED           : January 12, 2016
INVENTOR(S)     : Alexander Epple It is certified that error appears in the above-identified patent and that said Letters Patent is hereby corrected as shown below:

On the title page item (57), col. 2, line 6 under "ABSTRACT", delete "drive-" and insert -- drive --.

In the specification,

Col. 4, line 22, delete "archingdependent" and insert -- arching-dependent --.

Col. 15, line 60, delete "neodymiumbased" and insert -- neodymium-based --.

Col. 16, lines 15-16, delete "timesynchronized" and insert -- time-synchronized --.

In the claims,

Col. 16, line 61, Claim 8, delete "claim 1," and insert -- claim 7, --.

Col. 18, line 19, Claim 20, delete "A," and insert -- A method, --.

Signed and Sealed this
Third Day of May, 2016

Michelle K. Lee
*Director of the United States Patent and Trademark Office*